US007030488B2

(12) United States Patent
Kiss

(10) Patent No.: US 7,030,488 B2
(45) Date of Patent: Apr. 18, 2006

(54) PACKAGED COMBINATION MEMORY FOR ELECTRONIC DEVICES

(75) Inventor: David A. Kiss, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 150 days.

(21) Appl. No.: 10/017,031

(22) Filed: Oct. 30, 2001

(65) Prior Publication Data

US 2003/0080414 A1 May 1, 2003

(51) Int. Cl.
*H01L 23/34* (2006.01)

(52) U.S. Cl. ....................................... 257/723; 257/724

(58) Field of Classification Search ................ 257/777, 257/666, 688, 685, 723, 724, 686, 390; 438/109, 438/110
See application file for complete search history.

(56) References Cited

U.S. PATENT DOCUMENTS

| | | | | |
|---|---|---|---|---|
| 5,276,834 | A * | 1/1994 | Mauritz et al. | |
| 5,776,797 | A * | 7/1998 | Nicewarner et al. | |
| 5,777,345 | A | 7/1998 | Loder et al. | |
| 5,900,008 | A | 5/1999 | Akao et al. | |
| 6,168,973 | B1 | 1/2001 | Hubbard | |
| 6,208,521 | B1 * | 3/2001 | Nakatsuka | |
| 6,225,688 | B1 * | 5/2001 | Kim et al. | |
| 6,236,109 | B1 * | 5/2001 | Hsuan et al. | |
| 6,239,366 | B1 * | 5/2001 | Hsuan et al. | |
| 6,281,578 | B1 | 8/2001 | Lo et al. | |
| 6,359,340 | B1 * | 3/2002 | Lin et al. | 257/777 |
| 6,376,904 | B1 * | 4/2002 | Haba et al. | |
| 6,461,897 | B1 * | 10/2002 | Lin et al. | 438/109 |
| 6,737,750 | B1 * | 5/2004 | Hoffman et al. | 257/777 |
| 6,781,226 | B1 * | 8/2004 | Huppenthal et al. | 257/686 |
| 6,787,901 | B1 * | 9/2004 | Reyes et al. | 257/724 |
| 6,787,916 | B1 * | 9/2004 | Halahan | 257/777 |
| 6,853,064 | B1 * | 2/2005 | Bolken et al. | 257/686 |

FOREIGN PATENT DOCUMENTS

EP 0 386 631 A2 9/1990

OTHER PUBLICATIONS

*Plastic Memory,* GEEK.COM, Online, Jun. 28, 2001, retrieved from the Internet: URL:www.geek.com/news/geeknews/2001june/bch20010628006558.htm.

Tyson et al., *Nonvolatile, High Density, High Performance Phase-Change Memory,* IEEE, vol. 5, Mar. 18, 2000, pp. 358-390.

U. Kuhlmann et al., *Terabytes, shrink-wrapped. Is organic mass memory ready for series production,* Online, Mar. 1998, pp. 18-22, retrieved from the Internet: URL: http://www.heise.de/ct/english/98/03/018/>.

* cited by examiner

*Primary Examiner*—S. V. Clark
(74) *Attorney, Agent, or Firm*—Trop, Pruner & Hu, P.C.

(57) ABSTRACT

A variety of different types of memory, providing a complete memory solution, may be packaged together with a processor. As a result, a variety of different memory needs may be available in one package, particularly for portable applications. The packaged integrated circuit may include a cross-point memory, and a volatile memory.

16 Claims, 3 Drawing Sheets

PACKAGED COMBINATION MEMORY FOR ELECTRONIC DEVICES

BACKGROUND

This invention relates generally to memories or storage for electronic devices.

A wide variety of memory is available for a variety of specialized applications. For example, volatile memories, such as dynamic random access memory (DRAM) and static random access memory (SRAM), may be utilized for fast access to data. However, DRAM memory is difficult to integrate and SRAM memory is relatively high in cost.

Another type of memory is flash memory. However, flash memory is slower in write mode and has a limited number of write and erase cycles. Because it is nonvolatile memory, flash memory may be applicable to both code and data storage applications.

In a wide variety of electronic devices, there is a need for relatively low cost memory that performs a variety of different functions. Examples of such devices include portable devices, such as cellular telephones, personal digital assistants (PDAs), notebook computers, wearable computers, in-car computing devices, web tablets, pagers, digital imaging devices, and wireless communication devices, to mention a few examples.

Currently, the storage on processor-based systems is largely handled by semiconductor memories, such as SPAMs and DRAMs, and by mechanical devices, such as optical and magnetic disk drives. Disk drives are relatively inexpensive but have relatively slower read and write access times. Semiconductor memories are more expensive, but have relatively fast access times. Thus, electronic devices using a combination of disk drive and semiconductor memories for storage may place the bulk of the data and code in the disk drive and store frequently used or cache data on semiconductor memories.

However, none of the existing technologies adequately provide the needed attributes for a truly portable device including lower cost, lower power consumption, non-volatile memory compactness and easy integration. Thus, there is a need for new types of memory.

One new memory type is the polymer memory. The polymer memory involves polymer chains with dipole moments. Data may be stored by changing the polarization of a polymer between conductive lines. For example, a polymeric film may be coated with a large number of conductive lines. A memory location at a cross-point of two lines is selected when the two transverse lines are both charged. Because of this characteristic, polymer memories are one type of cross-point memory. Another cross-point memory being developed by Nantero, Inc. (Woburn, Mass.) uses crossed carbon nanotubules.

Cross-point memories are advantageous since no transistors are need to store each bit of data and the polymer layers can be stacked to a large number of layers, increasing the memory capacity. In addition, the polymer memories are non-volatile and have relatively fast read and write speeds. They also have relatively low costs per bit and lower power consumption. Thus, the polymer memory has a combination of low cost and high capacity that fits well in handheld data storage applications.

Phase-change materials may also be utilized to create memories. In phase-change memories, a phase-change material may be exposed to temperature to change the phase of the phase-change material. Each phase is characterized by a detectable electrical resistivity. To determine the phase of the memory during a read cycle, current may be passed through the phase-change material to detect its resistivity.

The phase-change memories are non-volatile and high density. They use relatively low power and are easy to integrate with logic. The phase-change memory may be suitable for many code and data storage applications. However, some high-speed volatile memory may still be needed for cache and other frequent write operations.

Thus, there is still a need for a memory solution for low cost, portable applications.

DETAILED DESCRIPTION

Figure 1:
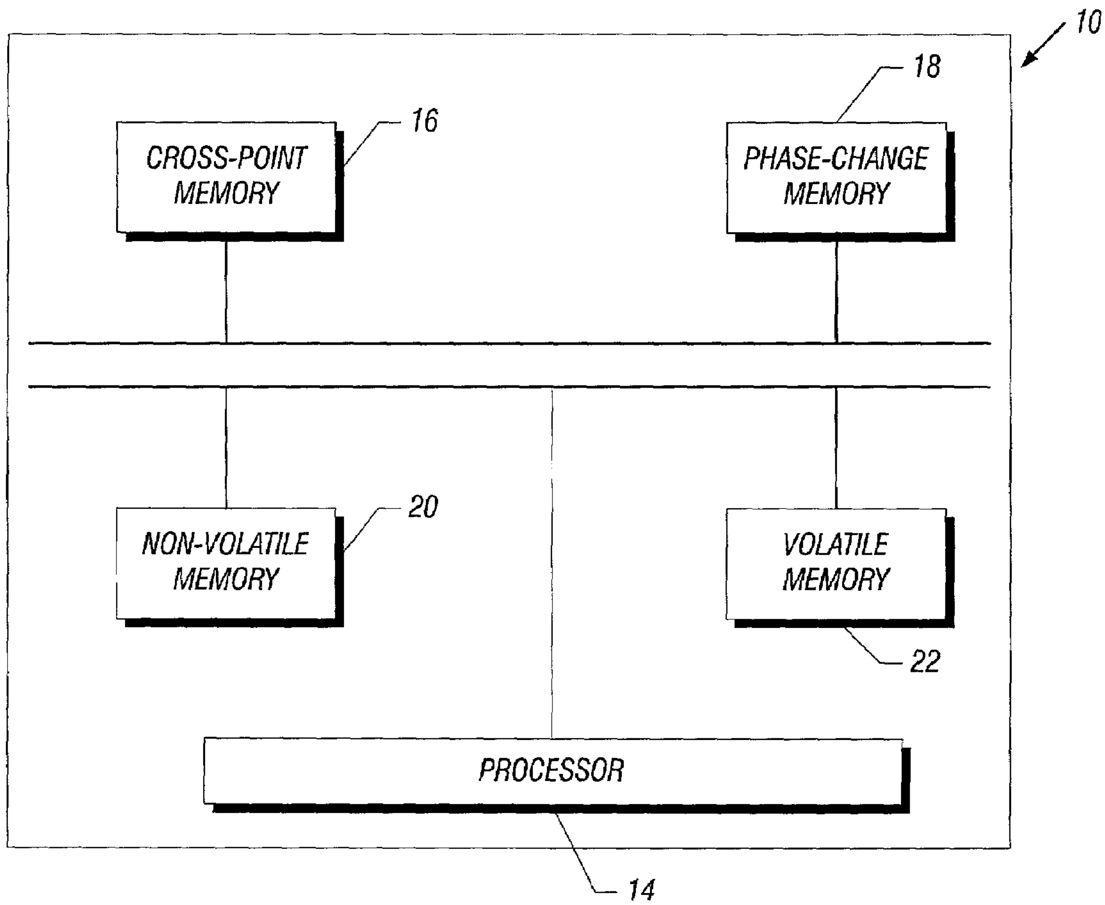
FIG. 1 is a block diagram of one embodiment of the present invention.

Referring to FIG. 1, a packaged integrated circuit device 10 may include a bus 12 that couples a plurality of memories of different memory types to a processor 14. By combining a plurality of different types of memory within the same package with a processor 14, a solution may be provided to the varying memory needs of a wide variety of portable device equipment manufacturers.

A cross-point memory 16 may be a polymer memory and may primarily be utilized for mass storage of data. A volatile memory 22 may be provided for cache and frequent write functions. A phase-change memory 18 may be utilized for both data and code storage needs and a non-volatile memory 20 may also be provided for code storage purposes.

The memories 16, 18, 20 and 22 may be integrated within the same integrated circuit package as separate dice in one embodiment of the present invention. In one embodiment of the present invention, the bus 12 may be integrated in the same die with the processor 14. Thus, each of the dice containing the memories 16, 18, 20 and 22 may be electrically coupled to a die including the processor 14 and the bus 12 in accordance with one embodiment of the present invention. For example, the dice containing the memories 16, 18, 20 and 22 may simply be stacked over a die containing the processor 14 and bus 12 and then the dice may be encapsulated within the same package 10.

By encapsulating the various memory types within a single package 10 with the processor 14, a solution may be provided to virtually any memory need of any portable device. Thus, portable device manufacturers may simply use the package 10 and may be assured that a complete solution is available for all their memory needs. This may improve the standardization of portable devices and, as a result, may reduce costs.

Figure 2:
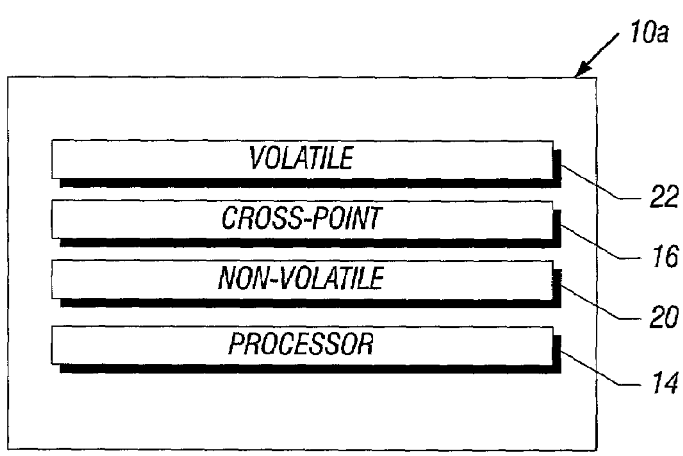
FIG. 2 is a schematic depiction of a package in accordance with one embodiment of the present invention.

Referring to FIG. 2, the package 10*a* may include a stack of four separate dice in accordance with one embodiment of the present invention. The lowermost die may include the processor 14. Moving upwardly, the next die above the processor 14 die may contain the non-volatile storage 20 and the next die above the non-volatile storage 20 die may include the cross-point memory 16. The uppermost die may include a volatile memory 22. Each of the dice may be electrically coupled to one another.

Figure 3:
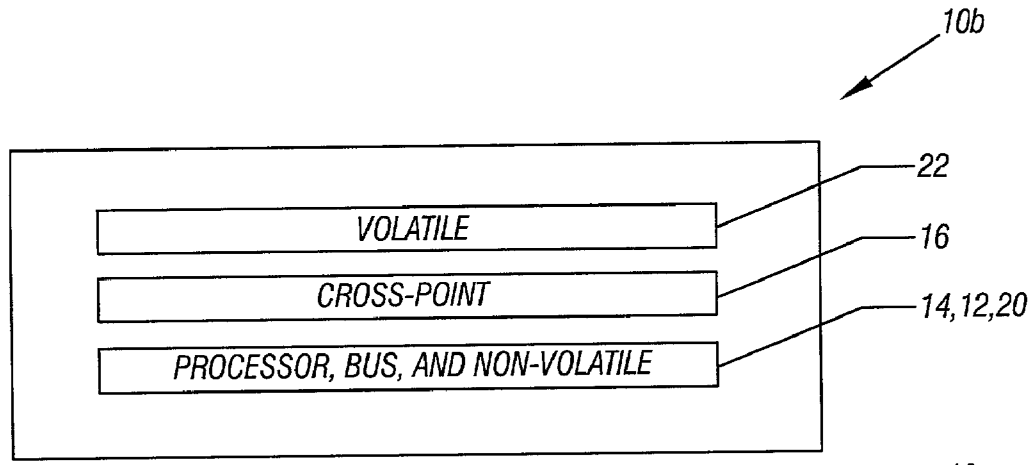
FIG. 3 is a schematic depiction of a package in accordance with another embodiment of the present invention.

Referring next to FIG. 3, the processor 14, bus 12, and non-volatile memory 20 may be integrated into the same die in the package 10*b*. In such an embodiment, a stack may include the die for the processor 14 and non-volatile memories 14 and 20 at the bottom, followed by the dice for the cross-point memory 16 and volatile memory 22, if needed.

Figure 4:
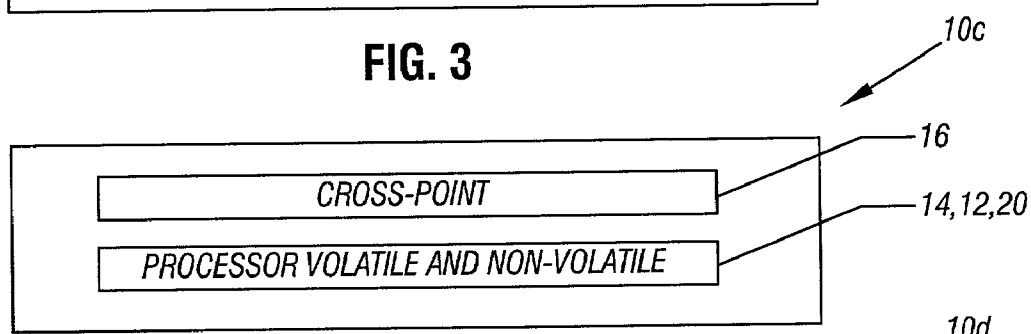
FIG. 4 is a schematic depiction of a package in accordance with still another embodiment of the present invention.

Referring to FIG. 4, in still another embodiment, a package 10*c* may include a die integrating the processor 14, volatile memory 20 and non-volatile memory 22 and a separate die may include the cross-point memory 16 in accordance with one embodiment of the present invention. of course, a wide variety of other integrated combinations of memory types may be included as well.

Figure 5:
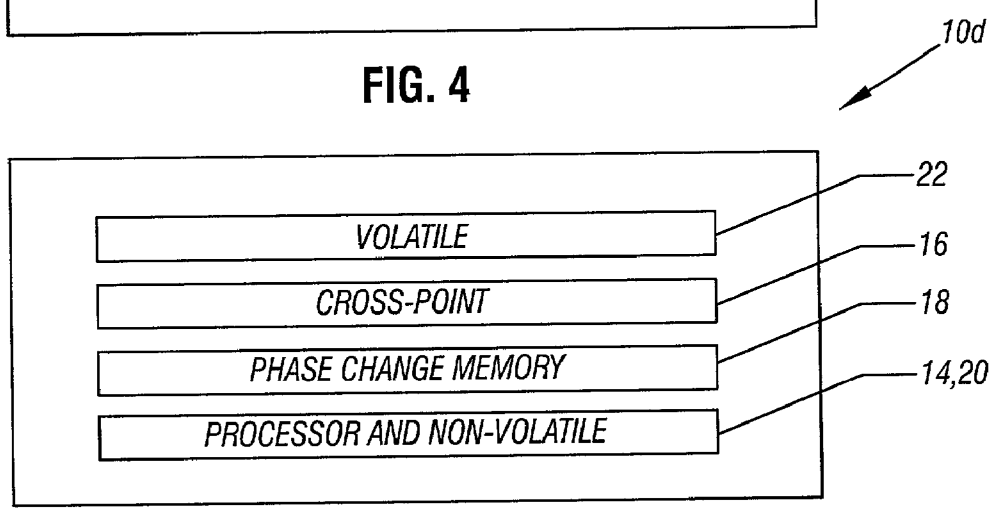
FIG. 5 is a schematic depiction of a package in accordance with yet another embodiment of the present invention.

Referring to FIG. 5, a package 10*d* may include a processor 14 and non-volatile memories 16 and 20, integrated into the same die. Another die may include the phase-change memory 18, still another die may include the cross-point memory 16 and yet another die may include the volatile memory 22. In various embodiments, one or more of the memory types may be omitted.

Figure 6:
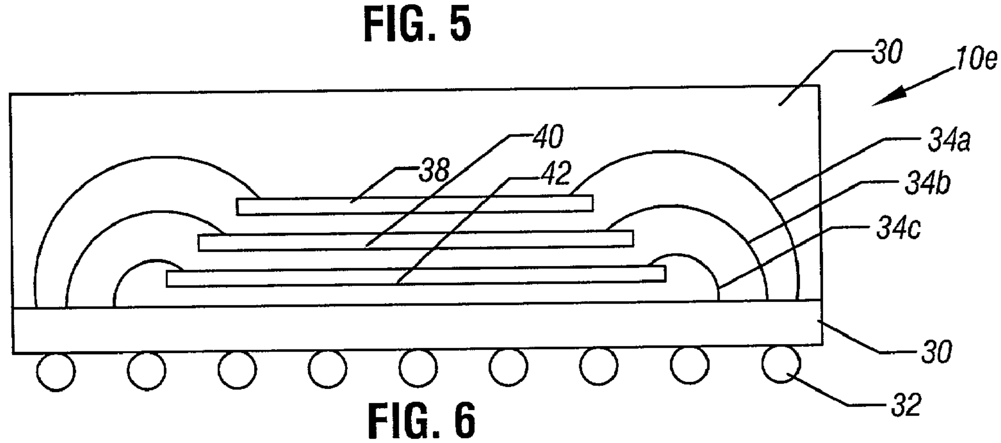
FIG. 6 is a cross-sectional view of a package in accordance with one embodiment of the present invention.

Finally, referring to FIG. 6, a specific package architecture is illustrated for the package 10*e* in accordance with one embodiment of the present invention. In this case, a substrate 30 may provide electrical connections as well as the bus 12. A separate die 42 may be provided, for example, for the processor 14, and one or more of the other memories 16, 18, 20 or 22. Still another die 40 may contain another one of the memories 16, 18, 20 or 22 and a third die 38 in the stack may contain still another memory type, such as one of the memories 16, 18, 20 or 22.

Electrical connections 34 may be provided from each die 38, 40 or 42 to the substrate 30 to provide electrical connections between the processor 14 and the memories 16, 18, 20 and 22 (as well as the bus 12). Any type of electrical connection to the external world may be provided on the package 10*e* including solder balls 32, in accordance with one embodiment of the present invention.

Figure 7:
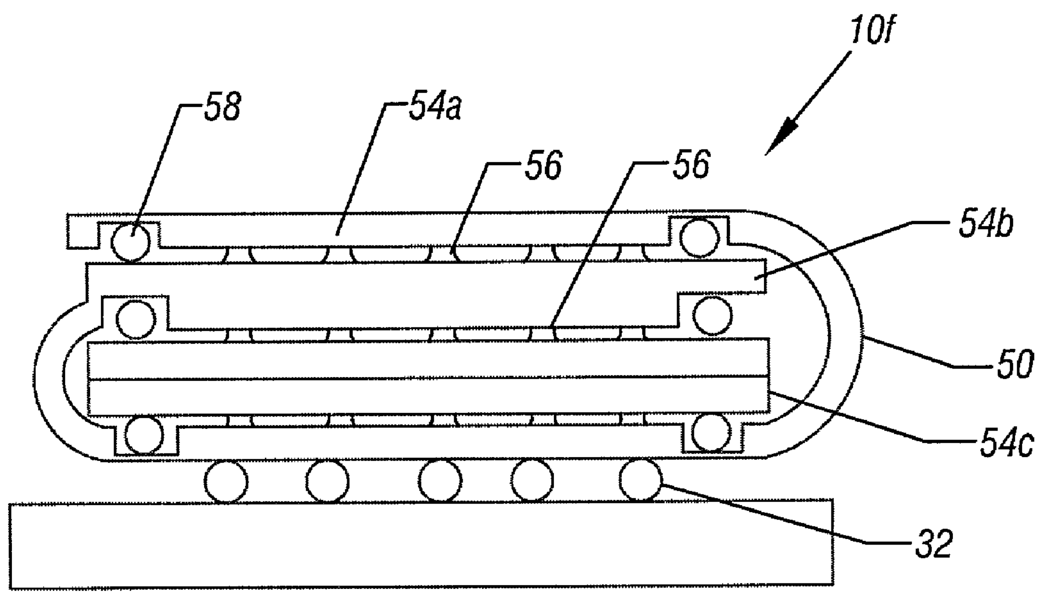
FIG. 7 is a cross-sectional view of a package according to another embodiment of the present invention.

Referring to FIG. 7, still another embodiment of the present invention may use a folded stacked package 10*f*. In this case, the package 10*f* may be formed by providing the dice 54 connected by flexible foldable tape 50. The tape 50 may be divided into sections, one section including the solder balls 32 and the die 52*c*, another section including the die 54*a* and still another section including the die 54*b*. The sections may be wing folded towards the center. As a result, surface mount interconnections 56 can be made between the various dice 54. Solder ball connections 58 may also be provided. Thus, in some embodiments, the dice 54 may include the processor 14, and one or more of the memories 16, 18, 20 or 22. Folded stacked packaging technology is available, from Tessera Technologies, Inc., San Jose, Calif., 95134.

In addition, the folded stacked packages may in turn be stacked to form a stack of folded stacked packages.

As still another alternative, a larger die such as a processor may have multiple stacks of other dice stacked on top of the processor. For example, a processor may have two sets of stacked dice on top of the processor die.

While the present invention has been described with respect to a limited number of embodiments, those skilled in the art will appreciate numerous modifications and variations therefrom. It is intended that the appended claims cover all such modifications and variations as fall within the true spirit and scope of this present invention.

The invention claimed is:

1. A packaged combination memory comprising:

an integrated non-volatile memory first circuit comprising a first memory type, said first circuit to mass store data;

an integrated volatile memory circuit to cache and make frequent writes;

an integrated non-volatile second circuit comprising a second memory type, said second circuit to store both data and code;

an integrated non-volatile third circuit comprising a third memory type, said third circuit to store code, said first, second, and third memory types all being different from one another;

a processor die coupled to said first, second, third, and non-volatile memory circuits to store information in a selected one of said circuits; and a semiconductor integrated circuit package containing said first, second, third, and non-volatile memory circuits as well as said processor.

2. The memory of claim 1 wherein said first circuit is a polymer memory.

3. The memory of claim 1 wherein said volatile memory circuit is a dynamic random access memory.

4. The memory of claim 1 wherein said second circuit is a phase change memory circuit.

5. The memory of claim 1 wherein said third circuit is a flash memory circuit.

6. The memory of claim 1 including at least two integrated circuit memory die and said processor die within said integrated circuit package.

7. The memory of claim 1 wherein said package includes contacts and said processor is coupled most directly to said contacts.

8. The memory of claim 1 including a polymer memory, a dynamic random access memory, a phase change memory, and a flash memory.

9. A method comprising:

packaging within one integrated circuit package a first circuit comprising a first memory type, said first circuit to mass store data, an integrated volatile memory circuit to cache and make frequent writes, an integrated circuit non-volatile second circuit comprising a second memory type, said second circuit to store both data and code, a third circuit to store code, said first, second, and third circuits all being non-volatile memories and being different from one another; and forming within said same package, a processor die coupled to said first, second, and third non-volatile memories and said volatile memory such that said processor to store information in a selected one of said circuits.

10. The method of claim 9 including packaging in said package a polymer memory as said first memory type.

11. The method of claim 9 including packaging in said package a dynamic random access memory as said volatile memory circuit.

12. The method of claim 9 including packaging a phase change memory as said second memory type.

13. The method of claim 9 including packaging a flash memory as said third circuit.

14. The method of claim 9 including packaging at least two integrated circuit memory die with said processor die in said package.

15. The method of claim 14 including coupling said memory die to package contacts through said processor die.

16. The method of claim 9 including packaging a polymer phase change and flash memory in said package.

* * * * *